US012802920B2

(12) United States Patent
Kai et al.

(10) Patent No.: US 12,802,920 B2
(45) Date of Patent: Nov. 17, 2026

(54) ION SOURCE

(71) Applicant: NISSIN ION EQUIPMENT CO., LTD., Koka-city (JP)

(72) Inventors: Hiroaki Kai, Koka-city (JP); Yuya Uchida, Koka-city (JP)

(73) Assignee: NISSIN ION EQUIPMENT CO., LTD., Koka-city (JP)

( * ) Notice: Subject to any disclaimer, the term of this patent is extended or adjusted under 35 U.S.C. 154(b) by 21 days.

(21) Appl. No.: 18/977,216

(22) Filed: Dec. 11, 2024

(65) Prior Publication Data

US 2025/0379022 A1 Dec. 11, 2025

(30) Foreign Application Priority Data

Jun. 5, 2024 (JP) ................................ 2024-091813

(51) Int. Cl.
*H01J 37/08* (2006.01)

(52) U.S. Cl.
CPC ......... *H01J 37/08* (2013.01); *H01J 2237/022* (2013.01)

(58) Field of Classification Search
CPC ......... H01J 37/04; H01J 37/08; H01J 2237/02
See application file for complete search history.

(56) References Cited

U.S. PATENT DOCUMENTS

| | | | | |
|---|---|---|---|---|
| 7,947,129 | B2 | 5/2011 | Murata et al. | |
| 10,971,339 | B2 | 4/2021 | Adachi et al. | |
| 2005/0016838 | A1* | 1/2005 | Murata ................... | H01J 27/16 204/192.32 |
| 2014/0041684 | A1* | 2/2014 | Kurunczi ................ | H01J 37/02 134/1.1 |
| 2020/0279720 | A1* | 9/2020 | Adachi ............. | H01J 37/32357 |

FOREIGN PATENT DOCUMENTS

JP 2013012495 A * 1/2013

* cited by examiner

*Primary Examiner* — Patrick C Chen
(74) *Attorney, Agent, or Firm* — Sughrue Mion, PLLC

(57) ABSTRACT

An ion source includes a plasma chamber, three or more extraction electrodes that extract an ion beam from the plasma chamber in an extraction direction, the three or more extraction electrodes including a first electrode, a second electrode and a third electrode in order from the plasma chamber in the extraction direction, an electrode driver that moves the third electrode in the extraction direction of the ion beam, and a controller that sets voltage potentials of the three or more electrodes. When the third electrode is cleaned, the electrode driver moves the third electrode along the extraction direction of the ion beam, and the controller controls the voltage potential of the third electrode to be smaller than the voltage potentials of remaining electrodes of the three or more extraction electrodes.

16 Claims, 10 Drawing Sheets

ION SOURCE

CROSS-REFERENCE TO RELATED APPLICATION

This application claims priority from Japanese Patent Application No. 2024-091813, filed on Jun. 5, 2024, in the Japan Patent Office, the contents of which being incorporated by reference herein in its entirety.

BACKGROUND

The present disclosure relates to an ion source having a function of cleaning an extraction electrode.

As an ion beam irradiation apparatus is operated, a deposit derived from a dopant gas adheres to an extraction electrode. When a dopant gas ($BF_3$, $PF_3$, $CO_2$, or the like) containing an element that easily reacts with a metallic member constituting an ion source is used, the amount of such deposits increases.

When a large amount of deposits adheres to the extraction electrode, the electrodes constituting the extraction electrode become insulated, and discharge occurs between the electrodes. In this case, it is difficult to stably operate the ion source, and the operation of the ion beam irradiation apparatus is stopped to clean the extraction electrode.

When the inside of the ion beam irradiation apparatus is opened to the atmosphere in cleaning the extraction electrode, a significant decrease in an operation rate of the ion beam irradiation apparatus is unavoidable. In order to avoid such a decrease in the operation rate, it has been proposed to clean the extraction electrode while maintaining the inside of the ion beam irradiation apparatus in a vacuum state.

SUMMARY

According to an aspect of one or more embodiments, there is provided an ion source comprising a plasma chamber; three or more extraction electrodes that extract an ion beam from the plasma chamber in an extraction direction, the three or more extraction electrodes including a first electrode, a second electrode and a third electrode in order from the plasma chamber in the extraction direction; an electrode driver configured to move the third electrode in the extraction direction of the ion beam; and a controller configured to set voltage potentials of the three or more electrodes. When the third electrode is cleaned, the electrode driver moves the third electrode along the extraction direction of the ion beam, and the controller controls the voltage potential of the third electrode to be smaller than the voltage potentials of remaining electrodes of the three or more extraction electrodes.

According to another aspect of one or more embodiments, there is provided an ion source comprising a plasma chamber; three or more extraction electrodes that extract an ion beam from the plasma chamber in an extraction direction, the three or more extraction electrodes including a first electrode, a second electrode and a third electrode in order from the plasma chamber in the extraction direction; an electrode driver configured to move a portion of three or more extraction electrodes, and a controller configured to set voltage potentials of the three or more extraction electrodes. When the third electrode is cleaned, the electrode driver increases a distance between the second electrode and the third electrode in the extraction direction of the ion beam, and the controller controls the voltage potential of the third electrode to be smaller than the voltage potentials of remaining electrodes of the three or more extraction electrodes.

BRIEF DESCRIPTION OF THE DRAWINGS

The above and/or other aspects will become apparent and more readily appreciated from the following description of various embodiments, taken in conjunction with the accompanying drawings, in which.

DETAILED DESCRIPTION

As for an ion source, heat transfer from a high-temperature plasma chamber to a first electrode closest to the plasma chamber occurs. Due to the influence of such heat transfer, the electrode temperature of the first electrode is relatively high, and the adhesion of the deposit onto the electrode is less likely to occur. On the other hand, a third electrode counting from the plasma chamber is far away from the plasma chamber. Therefore, the electrode temperature of the third electrode is lower than that of the first electrode, and the deposit tends to be deposited over a wide range of the electrode surface.

A related art technology uses a technique of generating a glow discharge by a cleaning gas between electrodes to be cleaned and cleaning deposits adhering to the surfaces of the electrodes disposed to face each other.

In the method of the related art technology, there are disadvantages in that, even if the electrode to be cleaned is only one of the electrodes arranged to face each other, two electrodes are cleaned. Ions in the plasma generated between the opposed electrodes are also used for cleaning of the electrode that are not the cleaning target. Therefore, the cleaning efficiency when cleaning one electrode is insufficient.

Another related art technology uses a technique of sputtering deposits deposited on the surface of an electrode to be cleaned by irradiating the electrode with an ion beam having a beam diameter with high sputter intensity by adjusting the voltage applied to each electrode constituting an extraction electrode system and the gas flow rate of a rare gas.

In the method of this related art technology, there are disadvantages in that, although the beam diameter is adjusted, the cleaning range is limited to the vicinity of the electrode hole, and it is difficult to expand the cleaning range of the target electrode.

Figure 1:
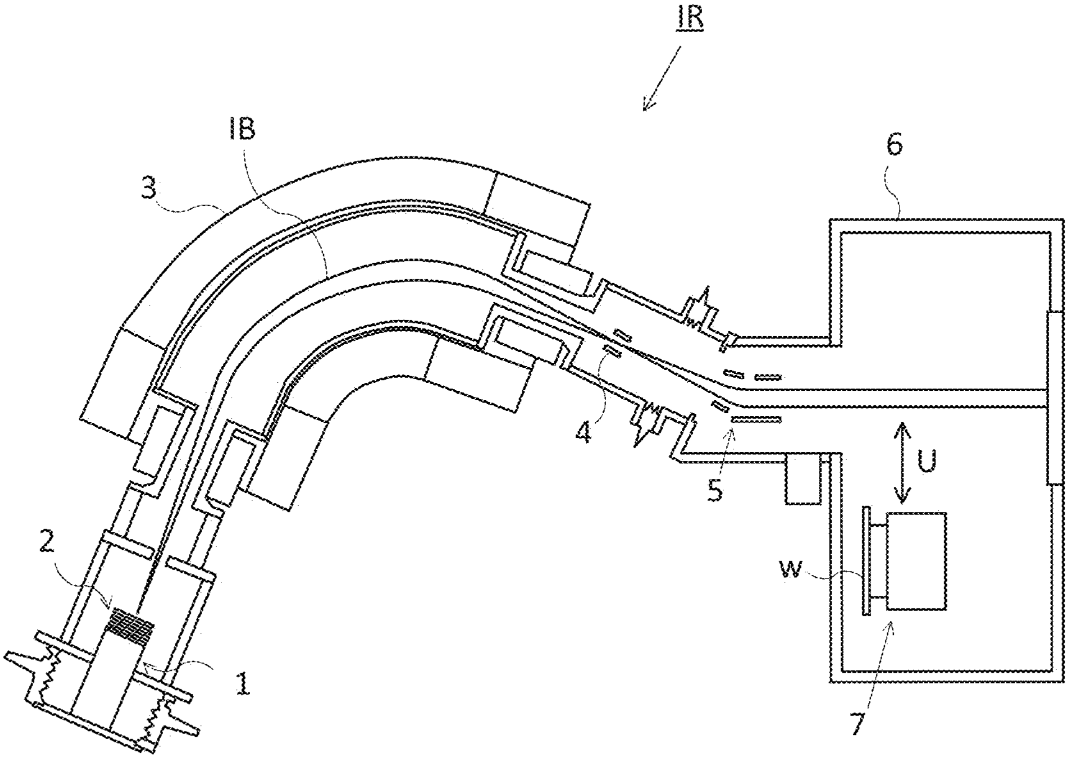
FIG. 1 is a schematic plan view of an example configuration of an ion beam irradiation apparatus, according to some embodiments.

FIG. 1 is a schematic plan view showing an example configuration of an ion beam irradiation apparatus IR. An ion source 1 includes an extraction electrode 2 that extracts an ion beam IB having a positive charge from a plasma. In some embodiments, the extraction electrode 2 may include three or more electrodes, and the detailed configuration thereof will be described with reference to FIG. 2 and subsequent drawings.

The ion beam IB extracted from the ion source 1 passes through a mass analyzing magnet 3 and an analyzing slit 4, and thereby ions having an undesired mass contained in the ion beam IB are removed.

Downstream of the analyzing slit 4, the ion beam IB passes through an electrostatic acceleration/deceleration tube 5, and is thereby converted into an ion beam IB having a desired energy. At the same time, the ion beam having an unnecessary energy component and a neutral beam are removed.

The ion beam IB extracted from the ion source 1 is called a ribbon beam or a sheet beam. The ion beam IB has a long dimension in the direction perpendicular to the paper surface of FIG. 1 in a cross section in a plane perpendicular to the traveling direction of the ion beam IB. The long dimension of the ion beam IB is longer than the diameter of a wafer W having a circular shape in a plan view.

A process chamber 6 is provided with a wafer driver 7 that supports the wafer W. The wafer driver 7 reciprocally scans the wafer W in the direction of arrow U across the ion beam IB, whereby the wafer W is irradiated with the ion beam.

Figure 2:
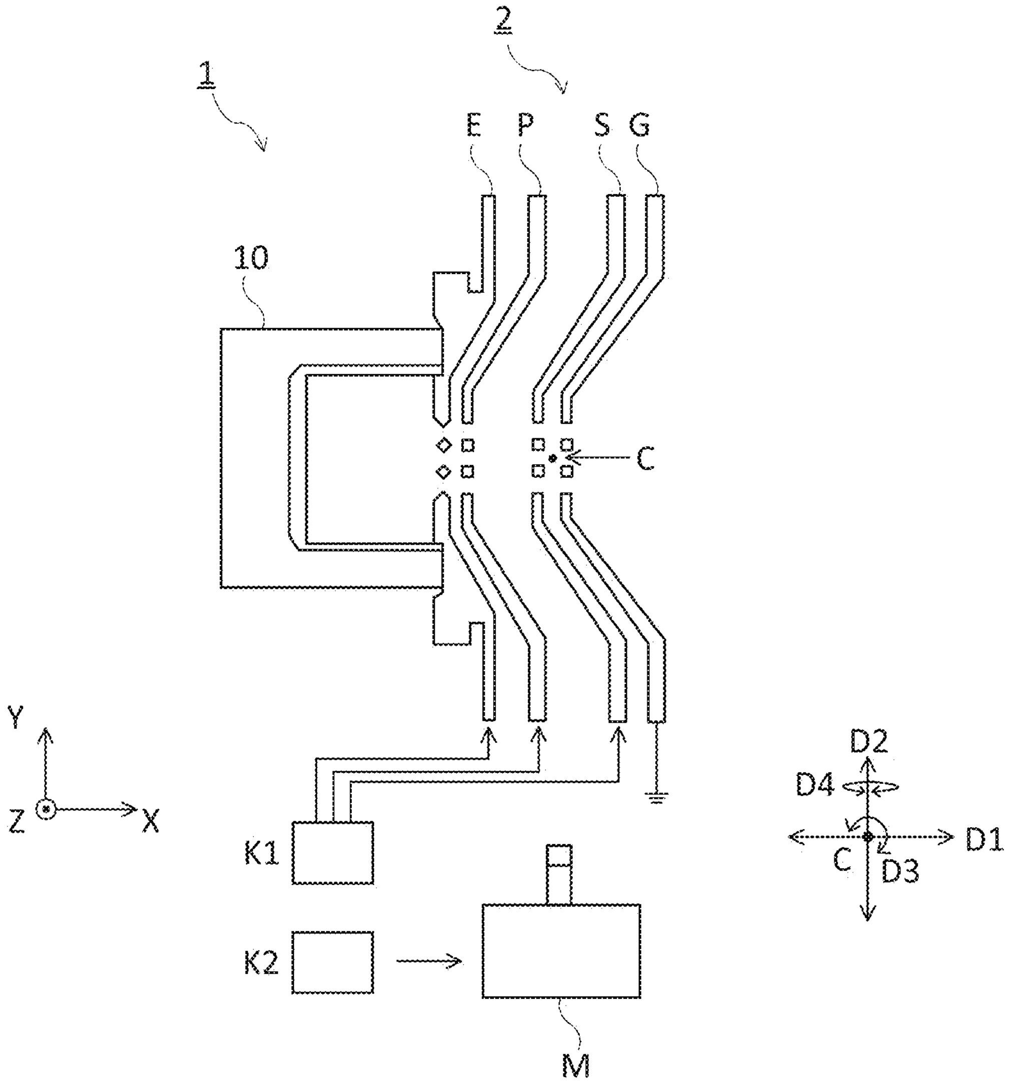
FIG. 2 is a schematic plan view of an example configuration of an ion source, according to some embodiments.

FIG. 2 is a schematic plan view of the ion source 1 shown in FIG. 1. The ion source 1 includes a plasma chamber 10 in which a plasma is generated and an extraction electrode 2 for extracting an ion beam IB having a positive charge from the plasma. In some embodiments, the extraction electrode 2 may include four electrodes. For example, the four electrodes may include a first electrode E, a second electrode P, a third electrode S, and a fourth electrode G in order from the plasma chamber 10 side in the extraction direction of the ion beam IB. The voltage potential setting of the electrodes is performed by the controller K1. In some embodiments, the controller K1 may include a processor and a memory. The processor may be a microprocessor, a central processing unit (CPU), a microcontroller, or hardware control logic, or some combination thereof. In some embodiments, the processor may be provided as a plurality of processors. In some embodiments, the controller K1 may be hardware control logic configured to set the voltage potentials of each of the first electrode E, the second electrode P, the third electrode S, and the fourth electrode G. In some embodiments, the controller K1 may include the processor, such as a microprocessor, a microcontroller, an ASIC, etc., and the processor may be configured to access program code stored in the memory and execute the program code to cause the processor to set the voltage potentials of each of set the voltage potentials of each of the first electrode E, the second electrode P, the third electrode S, and the fourth electrode G.

Figure 3:
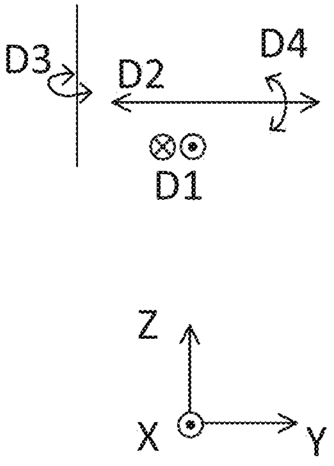
FIG. 3 is a schematic plan view of the ion source shown in FIG. 2 when a plasma chamber is viewed from a fourth electrode, according to some embodiments.
Figure 3:
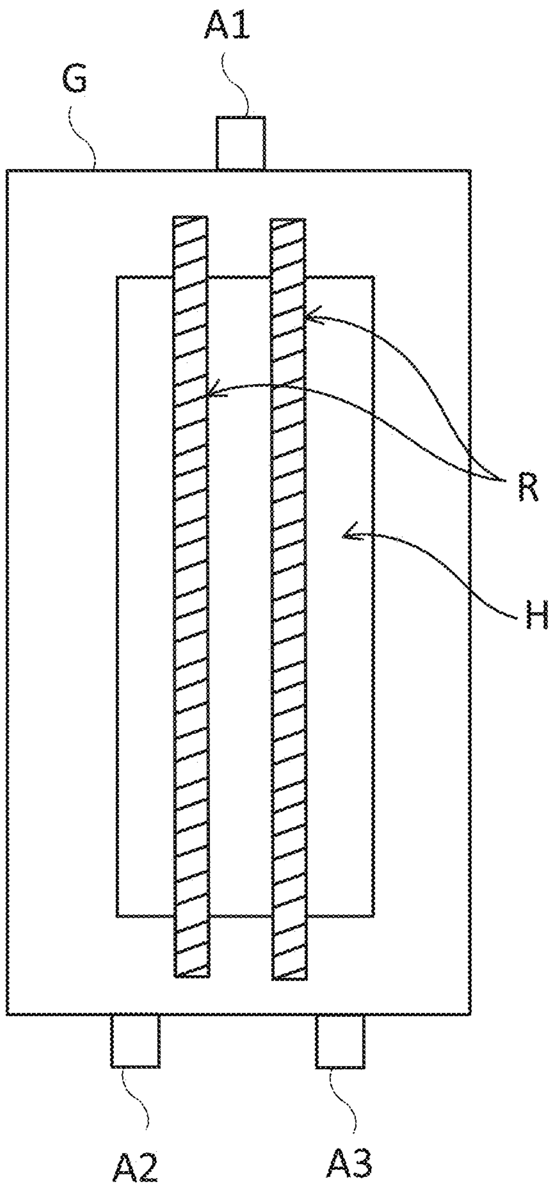

FIG. 3 is a schematic plan view of the plasma chamber 10 viewed from the fourth electrode G shown in FIG. 2 in a direction looking toward the plasma chamber 10. In FIGS. 2 and 3, the X direction shown in the drawings is the extraction direction of the ion beam. The Y direction and the Z direction are directions orthogonal to the X direction.

Similarly to the fourth electrode G shown in FIG. 3, the shape of each of the first electrode E, the second electrode P, and the third electrode S is a substantially rectangular shape in the YZ plan view which is long in the Z direction and short in the Y direction.

A plurality of openings H having a substantially rectangular shape in the YZ plane view is formed at substantially the center of each electrode. Two parallel rods R extending in the Z direction are attached to each opening H so as to straddle the opening H from one end to the other end. With this configuration, three slits elongated in the Z direction are formed in the opening H of each electrode. The extraction of the ion beam IB is performed through these slits.

The third electrode S and the fourth electrode G of the extraction electrode 2 are supported by an electrode driver M. The electrode driver M is configured to move a point C, which is the center position between the third electrode S and the fourth electrode G shown in FIG. 2, in the direction indicated by D1, D2, D3 and D4.

The directions of D1, D2, D3 and D4 are in the relationship shown in FIGS. 2 and 3. The D1 direction is a direction along the X direction. The D2 direction is a direction along the Y direction. The D3 direction is a direction around an axial line parallel to the Z direction. The D4 direction is a direction around an axial line parallel to the D2 direction.

The position of the point C shown in FIGS. 2 and 3 is based on the extraction electrode arrangement during normal operation of the ion source 1. The term normal operation is an operation of the ion source 1 when the ion beam irradiation processing is performed on the wafer W.

The electrode driver M may include a plurality of driving motors (not shown). The electrode driver M supports the third electrode S and the fourth electrode G at two positions, i.e., a A1 portion located above the third electrode S and the fourth electrode G, and a A2 portion and a A3 portion located below the third electrode S and the fourth electrode G. The A1, A2 and A3 portion are located on the same YZ plane including the point C shown in FIG. 2.

The electrode driver M functions to move the A1, A2 and A3 portions in the D1, D2, D3 and/or D4 directions together or independently.

The electrode driver M moves the A1 portion, the A2 portion, and the A3 portion of the third electrode S and the fourth electrode G together along the X direction, and thus the third electrode S and the fourth electrode G are moved in the D1 direction.

Similarly, the electrode driver M moves the A1 portion, the A2 portion, and the A3 portion of the third electrode S and the fourth electrode G together along the Y direction, and thus the third electrode S and the fourth electrode G are moved in the D2 direction.

The movement of the third electrode S and the fourth electrode G in the D3 direction is performed by moving the A3 portion in the D1 direction while fixing the positions of the A2 portion and the A1 portion, or by moving the A2 portion in the D1 direction while fixing the positions of the A1 portion and the A3 portion.

The movement of the third electrode S and the fourth electrode G in the D4 direction is performed by moving the A2 portion and the A3 portion together in the D1 direction while fixing the position of the A1 portion, or by moving the A1 portion in the D1 direction while fixing the positions of the A2 portion and the A3 portion.

The movement of the A1, A2 and A3 portions in the D1, D2, D3 and/or D4 directions is performed by a controller K2 that controls the electrode driver M. In some embodiments, the controller K2 may include a processor and a memory. The processor may be a microprocessor, a central processing unit (CPU), a microcontroller, or hardware control logic, or some combination thereof. In some embodiments, the processor may be provided as a plurality of processors. In some embodiments, the controller K2 may be hardware control logic configured to control the electrode driver M to move the A1, A2 and A3 portions in the D1, D2, D3 and/or D4 directions. In some embodiments, the controller K2 may include the processor, such as a microprocessor, a microcontroller, an ASIC, etc., and the processor may be configured to access program code stored in the memory and execute the program code to cause the processor to control the electrode driver M to move the A1, A2 and A3 portions in the D1, D2, D3 and/or D4 directions.

In the ion source 1, heat transfer from the high-temperature plasma chamber 10 to the electrode (first electrode E) closest to the plasma chamber 10 occurs. Due to the influence of such heat transfer, the temperature of the first electrode E is relatively high, and the adhesion of the deposit onto the electrode is less likely to occur. On the other hand, the third electrode S is largely separated from the plasma chamber 10. Therefore, the temperature of the third electrode S is lower than that of the first electrode E, and the deposit tends to be deposited over a wide range of the electrode surface. The surface of the electrode described here is a surface of the electrode on the plasma chamber 10 side.

Figure 4:
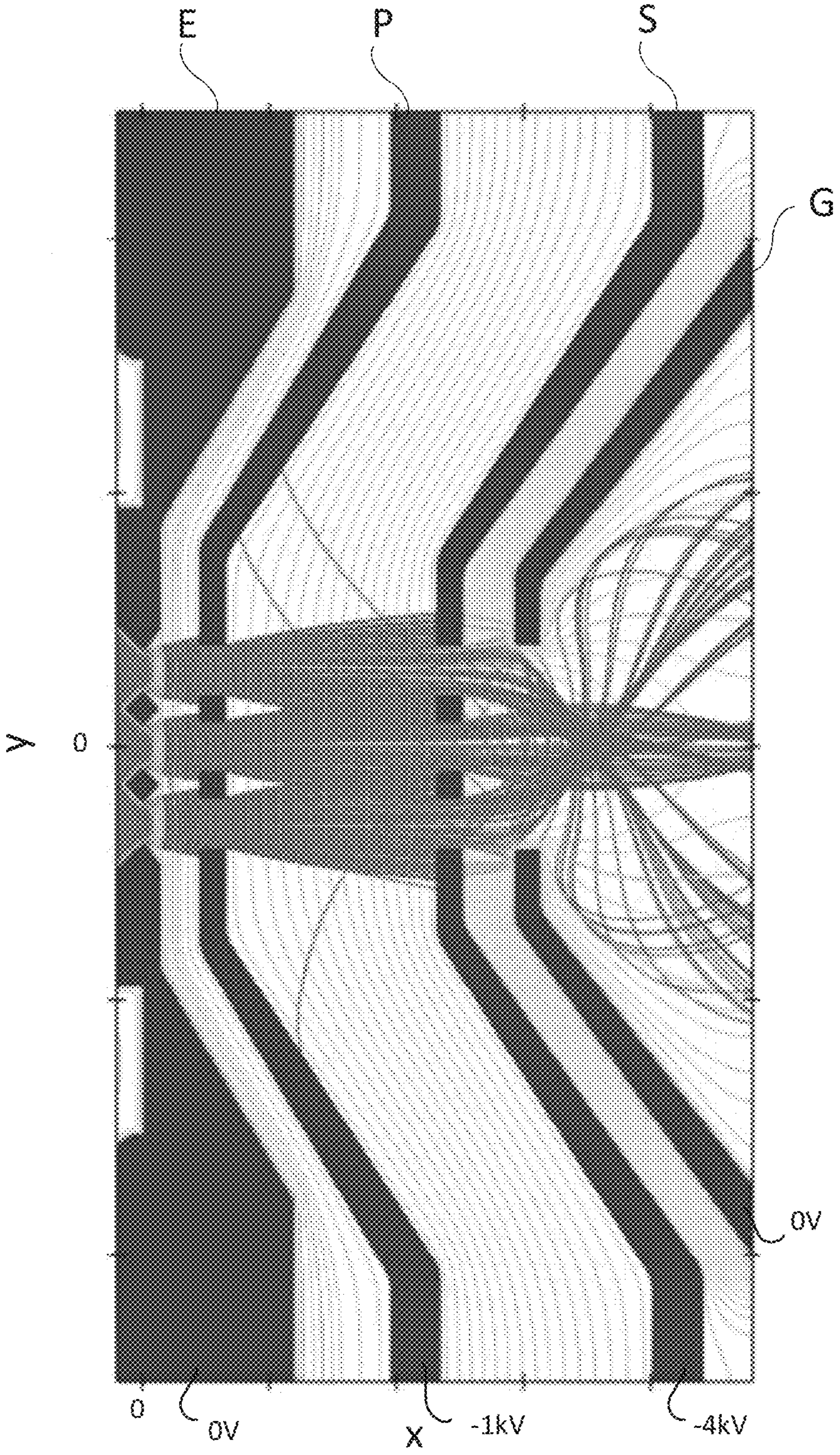
FIG. 4 is a simulation result of third electrode cleaning, according to some embodiments.
Figure 5:
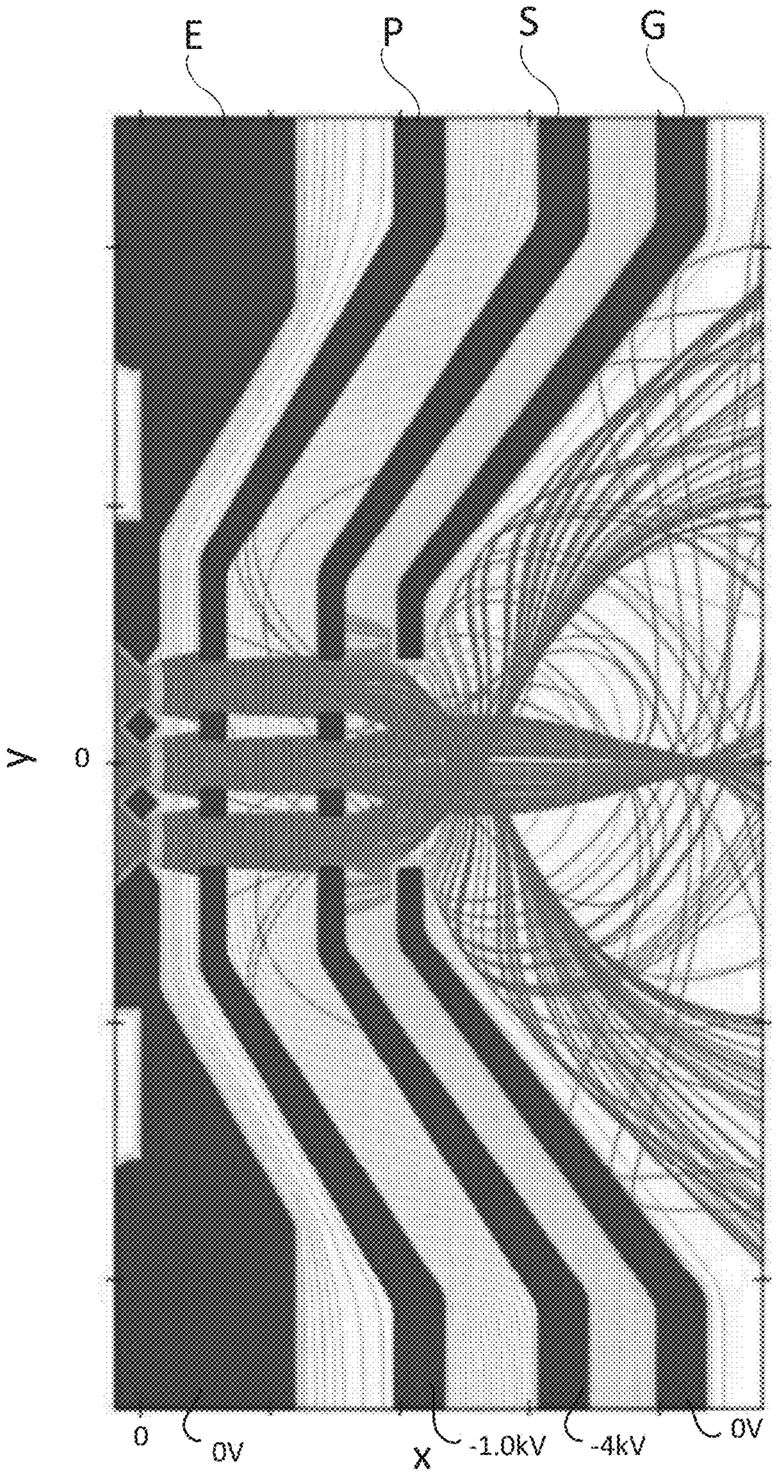
FIG. 5 is a simulation result of third electrode cleaning, according to some embodiments.
Figure 6:
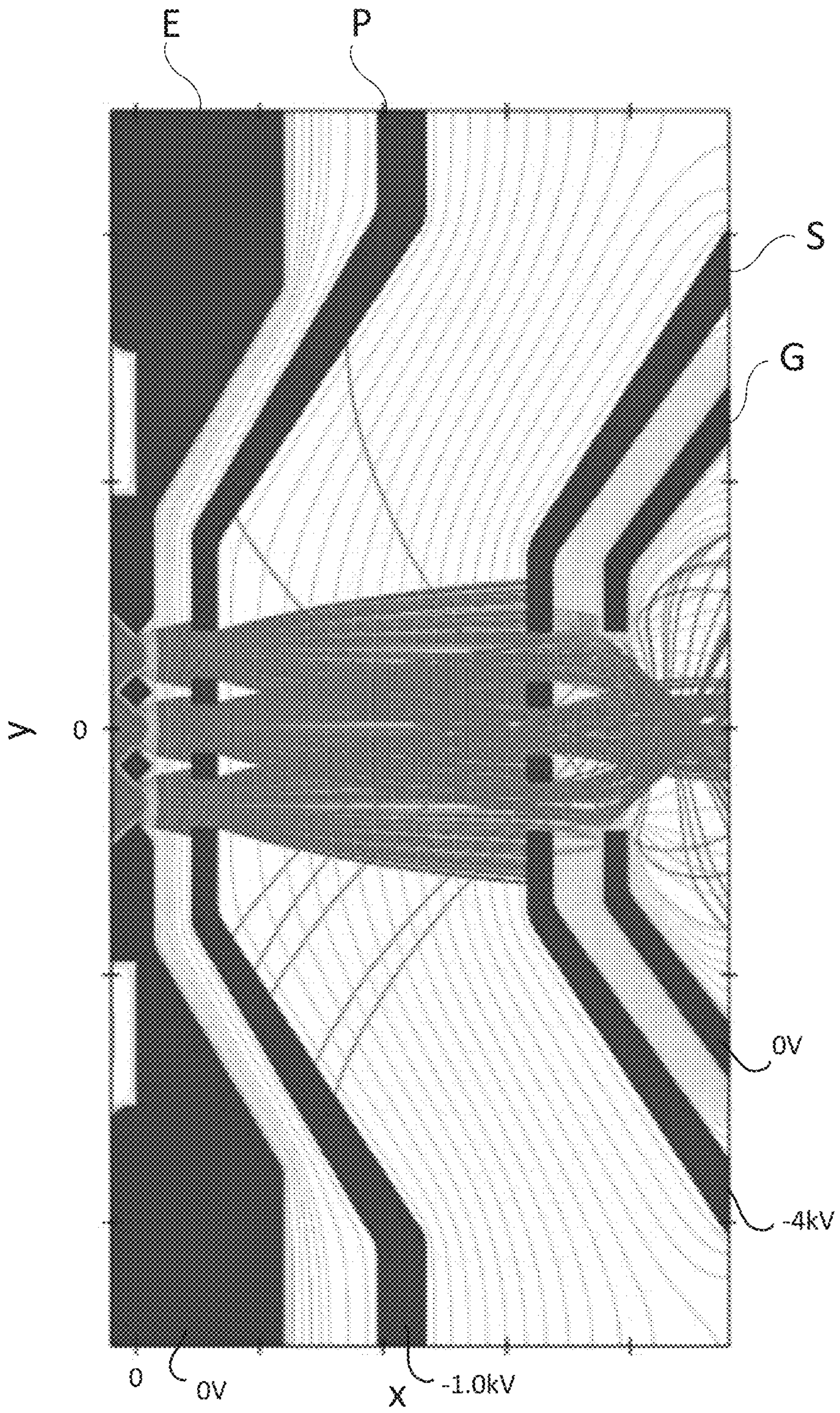
FIG. 6 is a simulation result of third electrode cleaning, according to some embodiments.

FIGS. 4 to 6 show the results of simulation of the trajectory of the ion beam IB during the cleaning operation of the ion source 1. Cleaning of the third electrode S is described with reference to FIGS. 4 to 6.

The positions of the third electrode S and the fourth electrode G shown in FIG. 4 are the same as the positions during normal operation in which the ion beam irradiation process is performed on the wafer W. As for the voltage potentials of the electrodes, the voltage potentials of the first electrode E and the fourth electrode G are set to OV, the voltage potential of the second electrode P is set to −1 kV, and the voltage potential of the third electrode S is set to −4 kV.

In the relationship of the voltage potentials of the electrodes, by setting the voltage potential of the third electrode S to be smaller than the voltage potentials of the other remaining electrodes, it is possible to attract the ion beam of positive charge to the surface of the third electrode S and to effectively sputter the third electrode S.

The magnitude of the voltage potential to be set varies depending on the distance between the electrodes and the energy of the extracted ion beam, and thus the value of the voltage potential shown here is merely an example.

In FIG. 5, the positions of the third electrode S and the fourth electrode G shown in FIG. 4 are moved to the plasma chamber 10 side (i.e., in the −X direction in FIG. 2), and the distance between the second electrode P and the third electrode S in the extraction direction of the ion beam IB is shortened.

In FIG. 6, the positions of the third electrode S and the fourth electrode G shown in FIG. 4 are moved to the side opposite from the plasma chamber 10 (i.e., in a +X direction in FIG. 2), and the distance between the second electrode P and the third electrode S in the extraction direction of the ion beam IB is increased.

When the trajectories of the ion beam IB are compared in FIGS. 4, 5 and 6, the simulation result shown in FIG. 6 is the most effective in uniform and wide range sputtering on the surface of the third electrode S. Therefore, in order to efficiently clean the surface of the third electrode S, it is advantageous to increase the distance between the second electrode P and the third electrode S in the extraction direction of the ion beam IB and to make the voltage potential of the third electrode S smaller than the voltage potentials of the other remaining electrodes constituting the extraction electrode 2.

The increase in the distance between the second electrode P and the third electrode S means that the distance between the electrodes is increased as compared with the distance between the electrodes during the normal operation in which the ion beam irradiation processing is performed on the wafer W, which is performed before the electrode cleaning.

In the embodiment illustrated in FIGS. 1-6, the cleaning of the third electrode S has been described, but the deposits adhere to the front and rear surfaces of the second electrode P located between the first electrode E and the third electrode S.

When the deposit on the second electrode P is deposited in the vicinity of the slit formed in the opening H, the extraction efficiency of the ion beam is reduced.

Further, when the deposit is locally deposited in the slit longitudinal direction, a singular point is generated in the beam profile of the ion beam extracted from the extraction electrode 2, and the ion beam irradiation processing to the wafer W is hindered. Such a phenomenon is likely to occur particularly in a ribbon beam or a sheet beam which transports the ion beam IB extracted from the ion source 1 without scanning.

Figure 7:
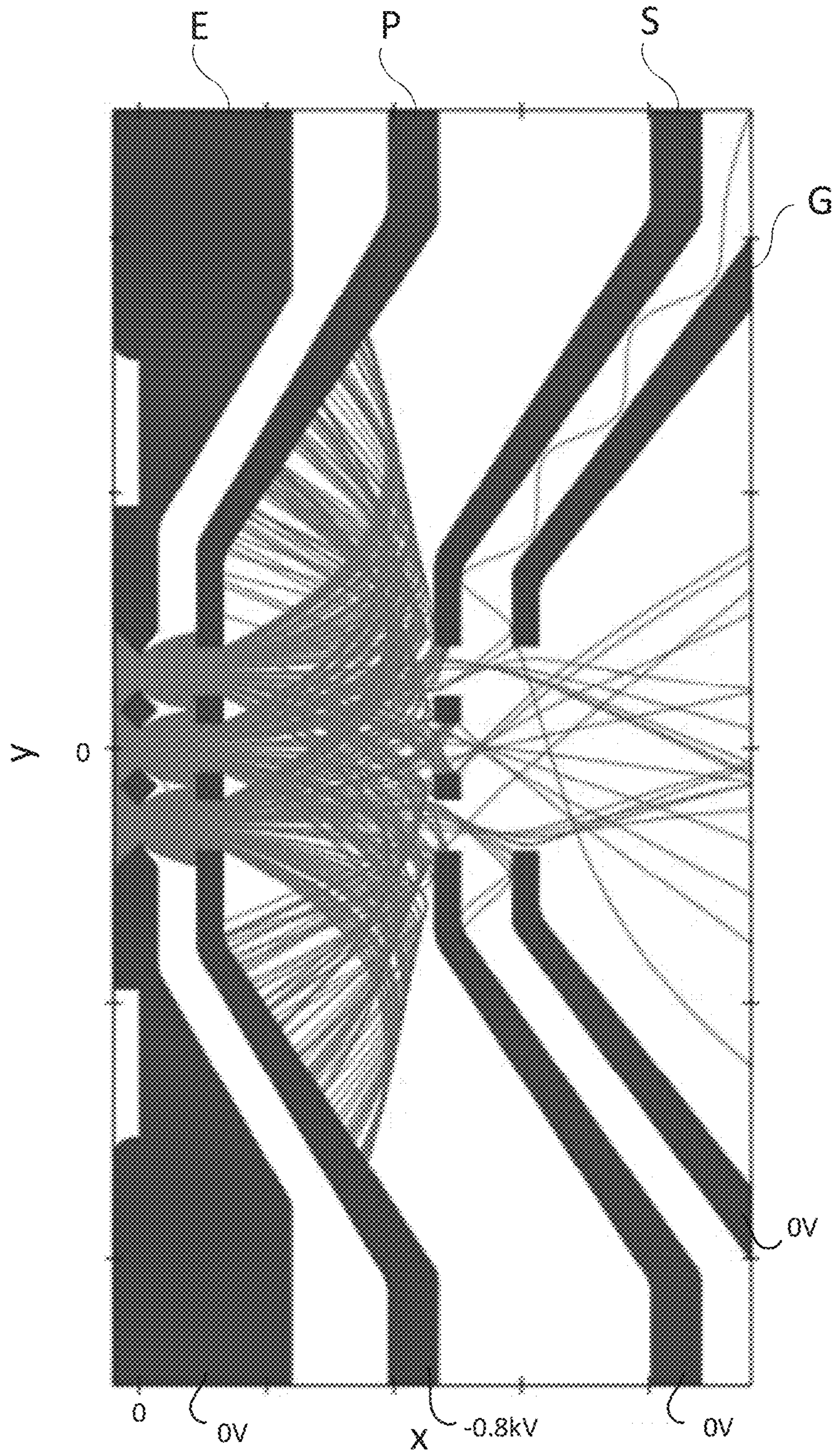
FIG. 7 is a simulation result of second electrode cleaning, according to some embodiments.

The positions of the third electrode S and the fourth electrode G shown in FIG. 7 are the same as the positions during normal operation in which the ion beam irradiation process is performed on the wafer W. The voltage potentials of the first electrode E, the third electrode S and the fourth electrode G are set to OV, and the voltage potential of the second electrodes P is set to −0.8 kV. In the relationship of the voltage potentials of the electrodes, the voltage potential of the second electrode P is set to be smaller than the voltage potentials of the other remaining electrodes, and thus the extraction of the ion beam having the positive charge and the pullback of the ion beam to the rear surface side of the second electrode P are realized.

The magnitude of the voltage potential to be set varies depending on the distance between the electrodes and the energy of the extracted ion beam, and thus the value of the voltage potential shown here is merely an example.

Figure 8:
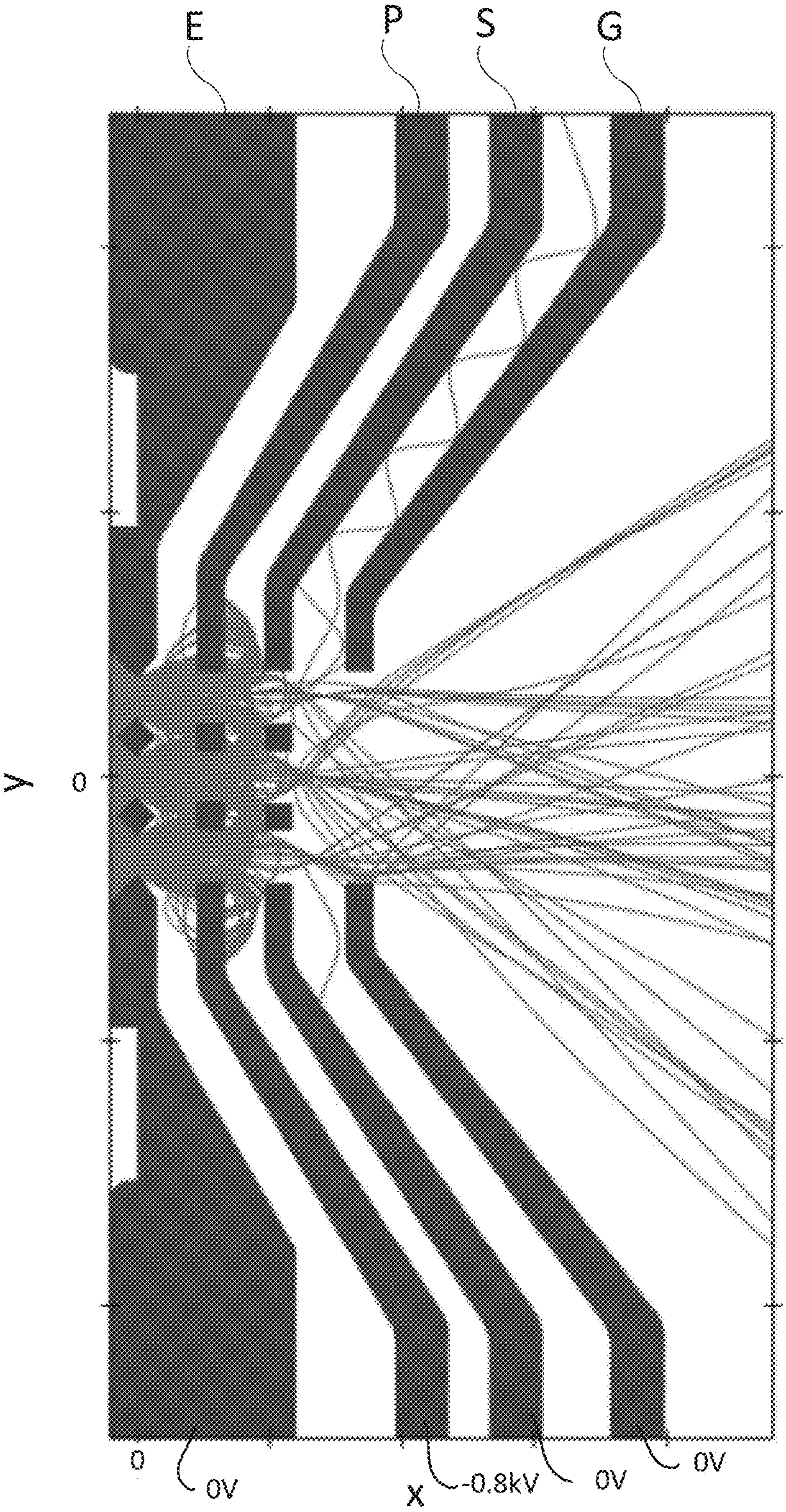
FIG. 8 is a simulation result of second electrode cleaning, according to some embodiments.

In FIG. 8, the positions of the third electrode S and the fourth electrode G shown in FIG. 7 are moved to the plasma chamber 10 side (i.e., in the −X direction in FIG. 2), and the distance between the second electrode P and the third electrode S in the extraction direction of the ion beam IB is shortened.

Figure 9:
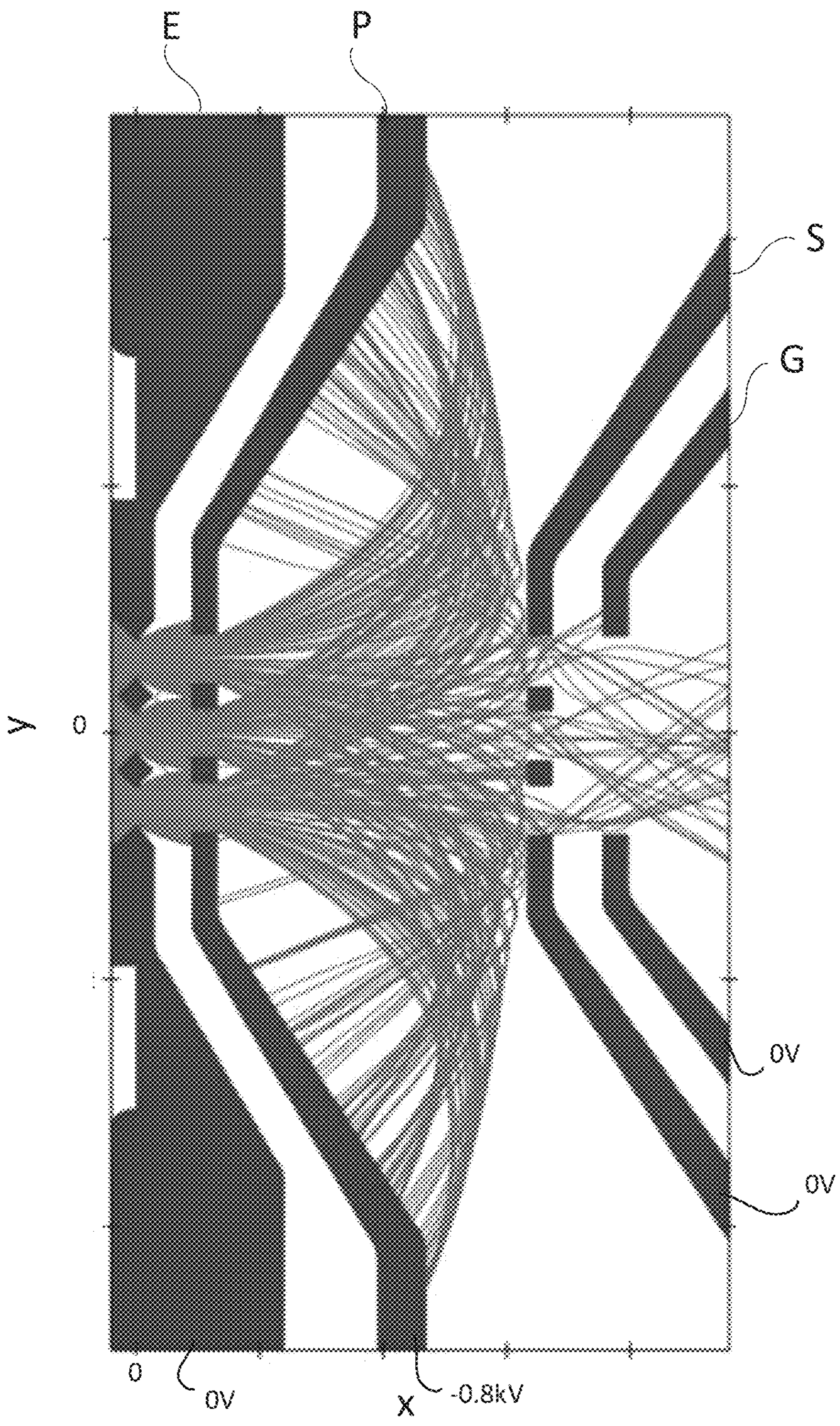
FIG. 9 is a simulation result of second electrode cleaning, according to some embodiments.

In FIG. 9, the positions of the third electrode S and the fourth electrode G shown in FIG. 7 are moved to the side opposite from the plasma chamber 10 (i.e., in the +X direction in FIG. 2), and the distance between the second electrode P and the third electrode S in the extraction direction of the ion beam IB is increased.

When the distance between the second electrode P and the third electrode S in the extraction direction of the ion beam IB is shortened, the minimum distance is an insulation distance at which discharge does not occur between the electrodes. This insulation distance varies according to the set voltage potential at both electrodes.

When the distance between the second electrode P and the third electrode S in the extraction direction of the ion beam IB is increased, the maximum distance is a distance in which the irradiation region of the ion beam irradiated on the electrode surface does not exceed the region of the electrode surface to be cleaned within a range in which physical interference due to the movement of the electrode does not occur. The maximum distance varies depending on the configuration of the ion source, the divergence angle of the ion beam extracted during cleaning, the cleaning region on the target electrode, and the like.

The definitions of the minimum distance and the maximum distance described here are the same for the simulation results of FIGS. 4 to 6.

When the trajectories of the ion beam IB are compared in FIGS. 7 to 9, the simulation result shown in FIG. 8 indicates that the sputtering near the slit for extracting the ion beam IB is the most effective on the front surface and the rear surface of the second electrode P.

Therefore, in order to efficiently clean the front and rear surfaces of the second electrode P, it is advantageous to reduce the distance between the second electrode P and the third electrode S in the extraction direction of the ion beam IB and to make the voltage potential of the second electrode P smaller than the voltage potentials of the other electrodes constituting the extraction electrode 2.

The reduction in the distance between the second electrode P and the third electrode S means that the distance between the electrodes is reduced as compared with the distance between the electrodes during the normal operation in which the ion beam irradiation processing is performed on the wafer W, which is performed before the electrode cleaning.

The energy of the ion beam IB extracted from the ion source 1 varies depending on the ion beam irradiation process. For example, when the ion beam IB having energy of several hundred eV is extracted as in the ion beam etching apparatus, the inter-electrode distance between the second electrode P and the third electrode S during the normal operation is very small.

Figure 10:
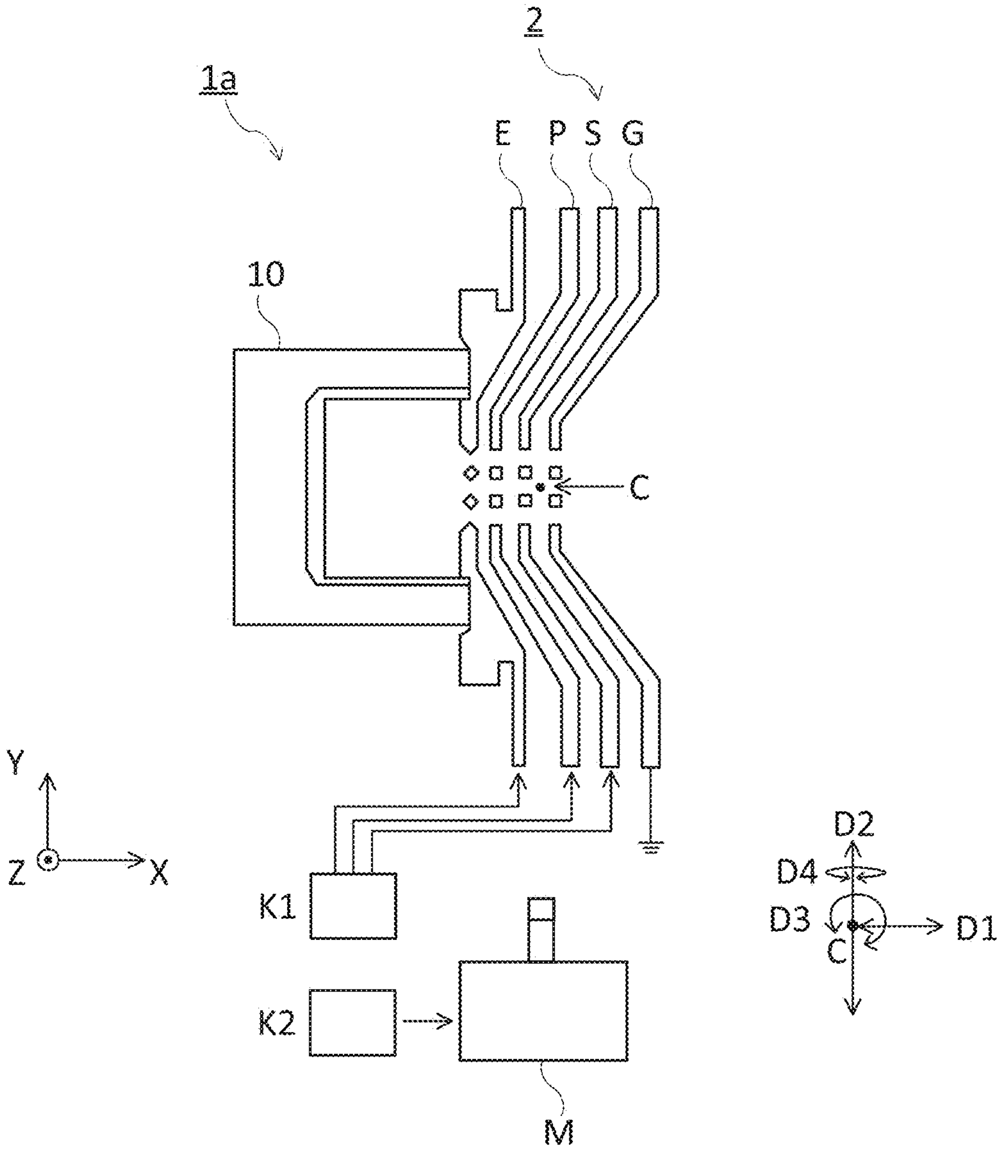
FIG. 10 is a schematic plan view of an example configuration of an ion source, according to some embodiments.

In such a case, as in the ion source 1*a* shown in FIG. 10, the point C, which is the center position between the third electrode S and the fourth electrode G, may be configured not to move toward the plasma chamber 10 (i.e., in the −X direction in FIG. 10) from the position during normal operation of the ion source 1*a*.

In the ion source 1*a* shown in FIG. 10, when the second electrode P is cleaned, the distances between the second electrode P and the third electrode S in the extraction direction of the ion beam are not changed, and the voltage potential of the second electrode P is made smaller than the voltage potentials of the other remaining electrodes constituting the extraction electrode 2.

On the other hand, when the third electrode S is cleaned, the third electrode S and the fourth electrode G are moved in the extraction direction of the ion beam IB (i.e., in the +X direction in FIG. 10) to increase the distance between the second electrode P and the third electrode S, and the voltage potential of the third electrode S is made smaller than the voltage potentials of the other remaining electrodes constituting the extraction electrode 2.

The cleaning of the second electrode P and the third electrode S may be performed independently according to the situation of the contamination of each electrode, or the cleaning of each electrode may be performed successively.

When the cleaning of the electrodes is performed successively, the second electrode P is advantageously cleaned first, as the order of cleaning the second electrode P and the third electrode S. This order is because the deposits sputtered when the second electrode P is cleaned are scattered to the third electrode S side, and the third electrode S is contaminated thereby.

Whether the cleaning of the second electrode and the third electrode is performed independently, continuously, or in which order is performed continuously is performed automatically according to the instructions from the controller K1.

For the cleaning of each electrode, a cleaning time may be set in advance, and the cleaning may be terminated when the cleaning time has elapsed. Further, an amperemeter may be connected to each electrode, and the cleaning may be terminated when the current value measured by the amperemeter during the cleaning period exceeds a threshold value. The threshold value may be predetermined and set in advance, or may be set experimentally.

The extraction electrode 2 of the ion source 1 and the ion source 1*a* shown in some embodiments are configured to extract the ion beam IB from three slits, but the configuration of the ion source is not limited thereto.

For example, as the extraction electrode 2, in some embodiments, a porous electrode in which circular holes are arranged in a matrix, a single slit electrode having a single slit, and the like can be used.

The extraction electrode 2 shown in some embodiments has a configuration including four electrodes, but the configuration of the extraction electrode is not limited thereto.

For example, the extraction electrode 2 may be constituted by three electrodes or by five electrodes. In the case of three electrodes, when the electrode is cleaned, the electrode driver M may move the third electrode in a direction along the extraction direction of the ion beam IB according to the configuration of the ion source. In the case of five electrodes, when the electrode is cleaned, the electrode driver M may move the third and subsequent electrodes in a direction along the extraction direction of the ion beam IB according to the configuration of the ion source.

In cleaning the second electrode P and the third electrode S described in some embodiments, the electrode driver M may be configured to move at least the third and subsequent electrodes in the D1 direction. However, in some embodiments, the electrode driver M may be configured to move at least the third and subsequent electrodes in the D2 direction, in the D3 direction, and/or in the D4 direction.

The movement of the electrodes in the D2 direction and the D4 direction is advantageous in adjusting the beam optical system of the ion beam IB extracted from the ion source 1 or the ion source 1*a*.

Further, after the third electrode S and subsequent electrode are moved in the D1 direction, the electrodes may be cleaned while moving the electrodes in different directions. For example, after the third electrode S and subsequent electrode are moved in the D1 direction, the irradiation region of the ion beam IB on the third electrode S may be expanded by moving the third electrode S and subsequent electrodes in the D2 direction or by tilting the third electrode S and subsequent electrodes in the D3 direction or the D4 direction, or the like. The movement of the third electrode S may be reciprocating in the D2 direction during cleaning the third electrode S.

In the embodiment shown in FIG. 2, a configuration is illustrated in which the controller K1 that applies voltages to each electrode and the controller K2 that controls the electrode driver M are provided separately, but in some embodiments, the controllers K1 and K2 may be integrated into one controller.

The dopant gas used during the normal operation of the ion source and the cleaning gas used during the cleaning of the electrode may be the same gas or different gases depending on the content of the ion beam irradiation process.

For example, in the ion implantation process, in some embodiments, $BF_3$ or $PH_3$ may be used as a dopant gas during normal operation, and Ar gas, $H_2$ gas, or $PH_3$ gas may be used as a cleaning gas during electrode-cleaning. In the ion beam etching process, in some embodiments, Ar gas may be used both during normal operation and during electrode cleaning.

In order to clean the electrodes more efficiently, it is advantageous that the electrodes be moved toward the D1 direction by the electrode driver M before the ion beam is extracted during the cleaning of the electrodes. However, in some embodiments, the electrode may be moved toward the D1 direction after the extraction of the ion beam during the cleaning of the electrodes, and may be disposed at predetermined positions during the cleaning.

It should be understood that embodiments are not limited to the various embodiments described above with reference to the drawings, but various other changes and modifications may be made therein without departing from the spirit and scope thereof as set forth in appended claims.

What is claimed is:

1. An ion source comprising:

a plasma chamber;

three or more extraction electrodes that extract an ion beam from the plasma chamber in an extraction direction, the three or more extraction electrodes including a first electrode, a second electrode and a third electrode in order from the plasma chamber in the extraction direction;

an electrode driver configured to move the third electrode in the extraction direction of the ion beam; and a controller configured to set voltage potentials of the three or more electrodes, wherein, when cleaning the second electrode, the electrode driver shortens a distance between the second electrode and the third electrode in the extraction direction, and the controller controls the voltage potential of the second electrode to be smaller than the voltage potentials of remaining electrodes of the three or more extraction electrodes.

2. The ion source according to claim 1, wherein, when the third electrode is cleaned, the electrode driver moves the third electrode along the extraction direction of the ion beam, and the controller controls the voltage potential of the third electrode to be smaller than the voltage potentials of remaining electrodes of the three or more extraction electrodes.

3. The ion source according to claim 2, wherein the controller controls the ion source to clean the third electrode after cleaning the second electrode.

4. The ion source according to claim 1, wherein the controller controls the ion source to clean the third electrode after cleaning the second electrode.

5. The ion source according to claim 1, wherein the three or more extraction electrodes include four electrodes in the extraction direction.

6. The ion source according to claim 5, wherein the electrode driver moves the third electrode and a fourth electrode that is downstream of the third electrode together along the extraction direction of the ion beam.

7. The ion source according to claim 1, wherein the three or more extraction electrodes each have three slits.

8. The ion source according to claim 7, wherein the three slits are formed by two rods.

9. The ion source according to claim 1, wherein the ion beam is a ribbon beam having a substantially rectangular cross section.

10. The ion source according to claim 1, wherein, when the third electrode is cleaned, after the electrode driver moves the third electrode alone the extraction direction of the ion beam, the electrode driver moves the third electrode in a crossing direction that crosses the extraction direction.

11. The ion source according to claim 10, wherein the electrode driver moves the third electrode reciprocally in the crossing direction during cleaning of the third electrode.

12. The ion source according to claim 1, wherein the electrode driver moves the third electrode in the extraction direction of the ion beam before starting cleaning of the third electrode.

13. The ion source according to claim 1, wherein, when the third electrode is cleaned, the electrode driver rotates the third electrode around an axis corresponding to the extraction direction or around an axis corresponding to a direction perpendicular to the extraction direction.

14. An ion source comprising:

a plasma chamber;

three or more extraction electrodes that extract an ion beam from the plasma chamber in an extraction direction, the three or more extraction electrodes including a first electrode, a second electrode and a third electrode in order from the plasma chamber in the extraction direction;

an electrode driver configured to move a portion of three or more extraction electrodes, and a controller configured to set voltage potentials of the three or more extraction electrodes, wherein when cleaning the second electrode, the electrode driver decreases a distance between the second electrode and the third electrode in the extraction direction, and the controller controls the voltage potential of the second electrode to be smaller than the voltage potentials of remaining electrodes of the three or more extraction electrodes.

15. The ion source according to claim 14, wherein, when the third electrode is cleaned, the electrode driver increases the distance between the second electrode and the third electrode in the extraction direction of the ion beam, and the controller controls the voltage potential of the third electrode to be smaller than the voltage potentials of remaining electrodes of the three or more extraction electrodes.

16. The ion source according to claim 15, wherein the controller controls the ion source to clean the third electrode after cleaning the second electrode.

* * * * *